United States Patent
Komiyama et al.

(10) Patent No.: US 10,187,976 B2
(45) Date of Patent: Jan. 22, 2019

(54) FLEXIBLE PRINTER CIRCUIT BOARD

(71) Applicant: LENOVO (SINGAPORE) PTE. LTD., Singapore (SG)

(72) Inventors: Hirohide Komiyama, Kanagawa-Ken (JP); Hideshi Tsukamoto, Tokyo-To (JP); Yasushi Yoshikawa, Shiga-Ken (JP); Mitsuru Ogawa, Kanagawa-Ken (JP)

(73) Assignee: LENOVO (SINGAPORE) PTE LTD, Singapore (SG)

( * ) Notice: Subject to any disclaimer, the term of this patent is extended or adjusted under 35 U.S.C. 154(b) by 4 days.

(21) Appl. No.: 15/446,727

(22) Filed: Mar. 1, 2017

(65) Prior Publication Data
US 2017/0257938 A1  Sep. 7, 2017

(30) Foreign Application Priority Data
Mar. 1, 2016 (JP) .................. 2016-039144

(51) Int. Cl.
 *H05K 1/02* (2006.01)
 *H05K 1/11* (2006.01)
 *H05K 1/14* (2006.01)

(52) U.S. Cl.
CPC ........... *H05K 1/028* (2013.01); *H05K 1/0277* (2013.01); *H05K 1/118* (2013.01); *H05K 1/147* (2013.01);
(Continued)

(58) Field of Classification Search
CPC .... H05K 1/028; H05K 1/0281; H05K 1/0283; H05K 1/118; H05K 1/147;
(Continued)

(56) References Cited

U.S. PATENT DOCUMENTS 2,634,310 A * 4/1953 Eislet .................. H01H 1/403
  174/72 TR
3,805,213 A * 4/1974 Austin .................. H05K 1/118
  174/117 FF
(Continued)

FOREIGN PATENT DOCUMENTS

| JP | 04-206374 | 7/1992 |
| JP | 07-335290 | 12/1995 |
| JP | 08-076890 | 3/1996 |
| JP | 2010-010198 | 1/2010 |
| JP | 2012-128717 A | 7/2012 |

*Primary Examiner* — Steven T Sawyer
*Assistant Examiner* — Paresh H Paghadal
(74) *Attorney, Agent, or Firm* — Antony P. Ng; Russell Ng PLLC

(57) ABSTRACT

A flexible printed circuit board (FPCB) is disclosed. The FPCB can be employed to connect an interface card having connectors with a two-stage configuration to a connection destination of a portable information equipment. The FPCB includes a bend line located between an upper-stage terminal group and a lower-stage terminal group. The FPCB can be bent along the bend line to allow the upper-stage terminal group and the lower-stage terminal group to be mutually superimposed over each other. In addition, the upper-stage terminal group of the FPCB is connected to the upper-stage-side connector terminal group of the interface card, and the lower-stage terminal group of the FPCB is connected to the lower-stage-side connector terminal group of the interface card.

4 Claims, 5 Drawing Sheets

(52) U.S. Cl.
CPC ......... *H05K 1/0281* (2013.01); *H05K 1/0283* (2013.01); *H05K 1/117* (2013.01); *H05K 2201/052* (2013.01); *H05K 2201/053* (2013.01); *H05K 2201/055* (2013.01); *H05K 2201/056* (2013.01); *H05K 2201/09081* (2013.01); *H05K 2201/09245* (2013.01); *H05K 2201/09254* (2013.01); *H05K 2201/09418* (2013.01)

(58) Field of Classification Search
CPC ......... H05K 2201/09418; H05K 1/025; H05K 1/117; H05K 1/0277; H05K 3/326; H05K 2201/052; H05K 2201/053; H05K 2201/055; H05K 2201/056; H05K 2201/09081; H05K 2201/09245; H05K 2201/09254; H05K 2201/09263; H01R 23/66; H01R 23/68; H01H 2207/004
See application file for complete search history.

(56) References Cited

U.S. PATENT DOCUMENTS

| | | | | |
|---|---|---|---|---|
| 4,561,709 | A * | 12/1985 | Fukukura | H05K 1/118 439/423 |
| 6,224,395 | B1 * | 5/2001 | Dahlen | H05K 1/028 439/67 |
| 6,519,021 | B1 * | 2/2003 | Aruga | G02F 1/13452 349/151 |
| 7,108,515 | B2 * | 9/2006 | Tanabe | H05K 1/118 349/150 |
| 2006/0223346 | A1 * | 10/2006 | Fujii | G06F 3/041 439/76.2 |
| 2009/0236126 | A1 * | 9/2009 | Miyahara | H05K 1/025 174/254 |
| 2012/0293470 | A1 * | 11/2012 | Nakata | H01J 11/12 345/204 |

* cited by examiner

FLEXIBLE PRINTER CIRCUIT BOARD

PRIORITY CLAIM

The present application claims benefit of priority under 35 U.S.C. §§ 120, 365 to the previously filed Japanese Patent Application No. JP2016-039144 with a priority date of Mar. 1, 2016, which is incorporated by reference herein.

TECHNICAL FIELD

The present invention relates to printer circuit boards in general, and in particular to a flexible printed circuit board for connecting to an interface card.

BACKGROUND

PCI Express is one of the well-known standards for high-speed serial interfaces. PCI Express has a high data transfer speed and flexibility that is widely utilized in extension boards such as graphics cards and so forth. In recent years, a communication protocol that is based on PCI Express has been employed in communications between various types of equipment and a cable adapter based on PCI Express. For example, the PCI Express-based communication protocol is also used in extension boards in various kinds of portable information equipment such as tablet-type personal computers, smartphones, etc.

Incidentally, a thin profile is strongly preferred in portable information equipment such as those described above. However, it would be difficult for a portable information equipment to have a thin profile if the portable information equipment is allowed interface cards based on PCI Express M.2 having connectors with a two-stage configuration (i.e., an tipper-stage side connector terminal group and a lower-stage-side connector terminal group) to be directly connected to a motherboard of the portable information equipment.

Consequently, it would be preferable to provide an improved method for connecting an interface card having connectors with a two-stage configuration to a thin-profile portable information equipment.

SUMMARY

In accordance with an embodiment of the present disclosure, a flexible printed circuit board is employed to connect an interface card having connectors with a two-stage configuration to a connection destination of a portable information equipment. The flexible printed circuit board includes a bend line located between an upper-stage terminal group and a lower-stage terminal group. The flexible printed circuit board can be bent along the bend line to allow the upper-stage terminal group and the lower-stage terminal group to be mutually superimposed over each other. In addition, the upper-stage terminal group of the flexible printed circuit board is connected to the upper-stage-side connector terminal group of the interface card, and the lower-stage terminal group of the flexible printed circuit board is connected to the lower-stage-side connector terminal group of the interface card.

All features and advantages of the present disclosure will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION

Figure 1:
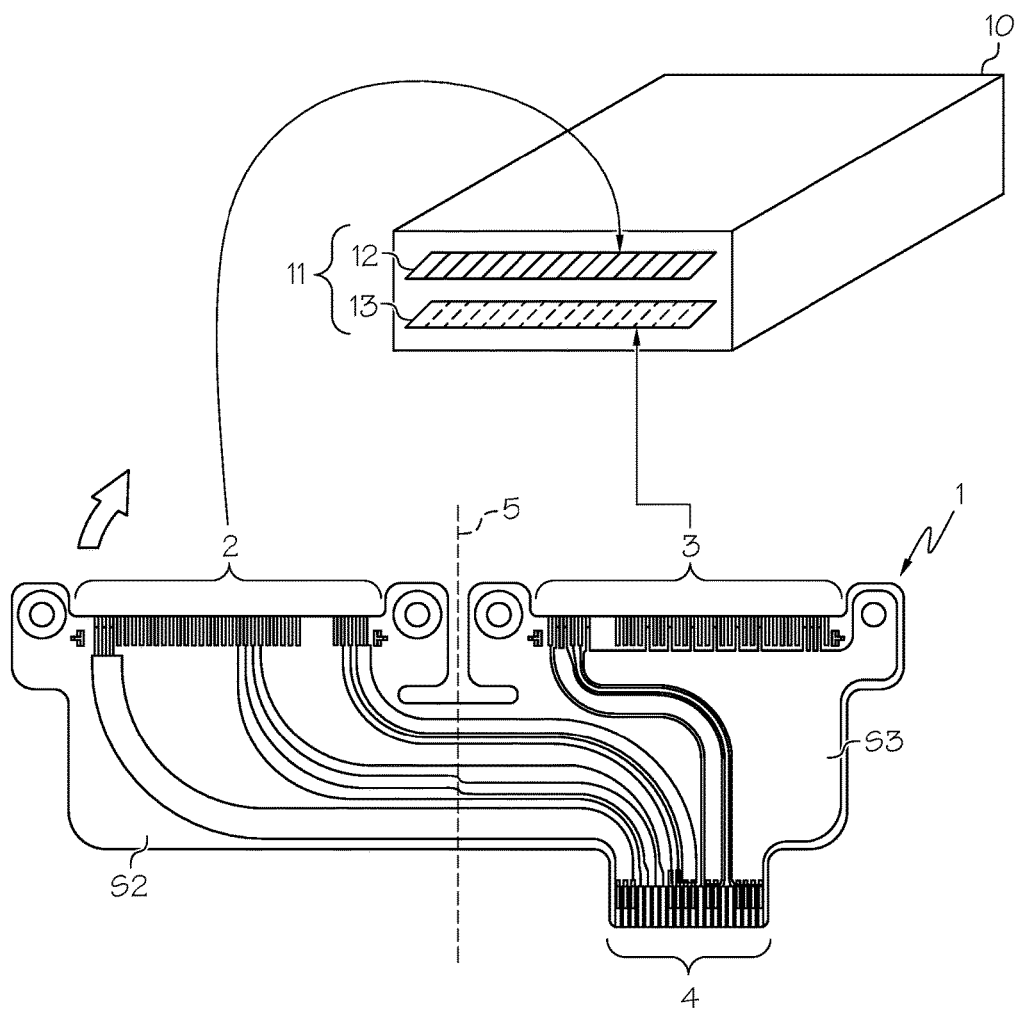
FIG. 1 illustrates a flexible printed circuit board is about to be connected to an interface card.
Figure 2:
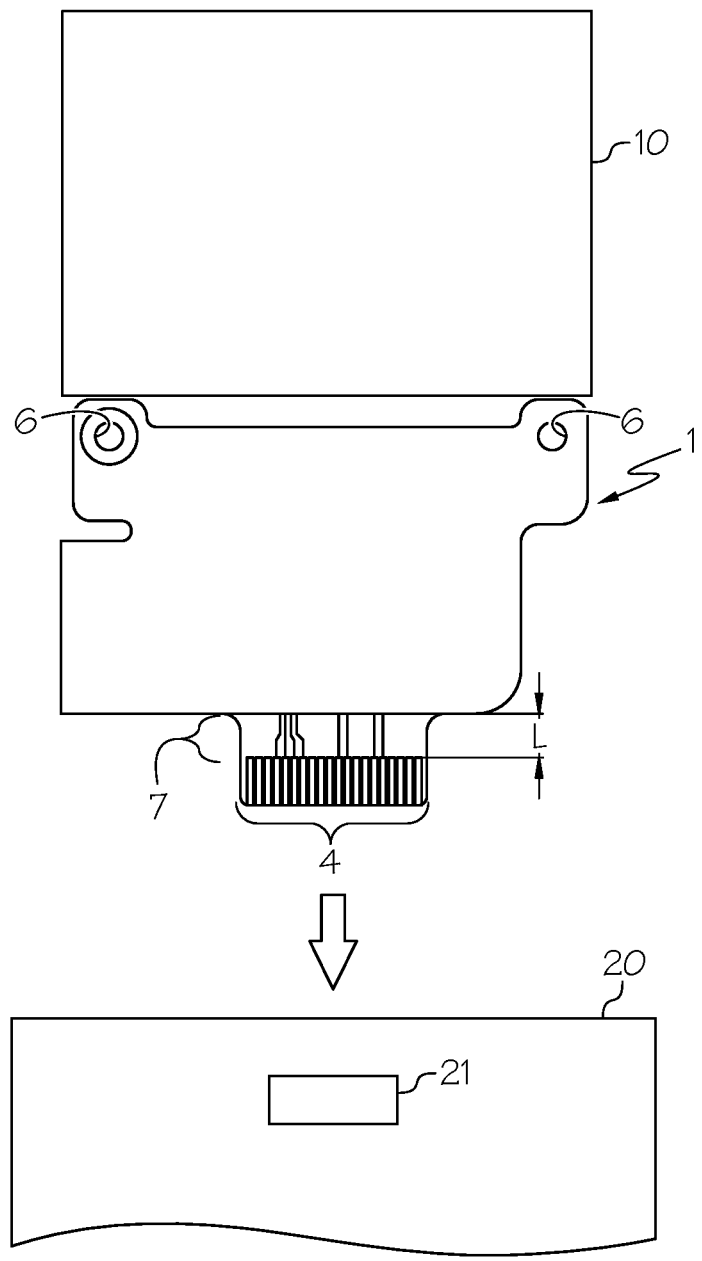
FIG. 2 illustrates the flexible printed circuit board from FIG. 1 has been connected to the interface card.

FIG. 1 illustrates a flexible printed circuit board (FPCB) 1, according to one embodiment, is about to be connected to an interface card 10, and FIG. 2 illustrates the FPCB 1 has been connected to the interface card 10.

As illustrated in FIG. 1, the interface card 10 includes a card edge connector 11. The card edge connector 11 has a two-stage configuration including an upper-stage-side connector terminal group 12 and a lower-stage-side connector terminal group 13. One metal terminal is formed on the front surface side of the upper-stage-side connector terminal group 12 and another metal terminal is formed on the back surface side of the lower-stage-side connector terminal group 13.

On the FPCB 1, an upper-stage terminal group 2 to be connected to the upper-stage-side connector terminal group 12 is formed on one end side to be connected to the card edge connector 11. In addition, a lower-stage terminal group 3 to be connected to the lower-stage-side connector terminal group 13 is formed also on one end side. The upper-stage terminal group 2 and the lower-stage terminal group 3 are arranged in series in a mutually separated state. The upper-stage terminal group 2 and the lower-stage terminal group 3 are mutually separated by a bend line 5 and are respectively arranged in areas S2 and S3.

An other-end terminal group 4 to be connected to a FPCB connector 21 illustrated in FIG. 2 is formed on the other end side of the FPCB 1. Terminals of the other-end terminal group 4 are arrayed at a pitch which is the same as that of terminals of the FPCB connector 21.

The other-end terminal group 4 is arranged in the area S2 or the area S3 that is located on either one side of the bend line 5. In the example shown in FIG. 1, the other-end side terminal group 4 is formed in the area S3 on the lower-stage terminal group 3 side. It is requested to form the other-end terminal group 4 so as not to stride over the bend line 5. The FPCB 1 is printed so as to draw only requested signal lines and power lines out of the card edge connector 11 and the signal lines and the power lines so drawn-out are brought together to the other-end terminal group 4.

In connection of the FPCB 1 to the interface card 10, first, the lower-stage terminal group 3 is connected to the lower-stage-side connector terminal group 13. This connection is adhered by using an anisotropic dielectric. Then, the FPCB 1 is bent along the bend line 5 and the upper-stage terminal group 2 is connected to the upper-stage-side connector terminal group 12. Also this connection is adhered by using the anisotropic dielectric. Due to the adhesion, the FPCB 1 is connected to the interface card 10 as illustrated in FIG. 2. Incidentally, when the FPCB 1 is being bent, the area S2 side or the area S3 side may also be bent.

Incidentally, openings 6 are for screw clamp and in the FPCB 1, a bent state of the FPCB 1 is protected by screw clamping. A height of screw clamping is held within a range not exceeding the thickness of the interface card 10.

As illustrated in FIG. 2, the other-end terminal group 4 is inserted into the FPCB connector 21 arranged on a substrate 20 such as a motherboard. Thus, the FPCB 1 and the substrate 20 are connected together. As a result, the substrate 20 and the interface card 10 are connected together via the FPCB 1.

Incidentally, a length L of a base part 7 of the other-end terminal group 4 of the FPCB 1 is adjusted as requested. Thereby, flexible arrangement of the FPCB 1 relative to the interface card 10 becomes possible. In particular, since the interface card 10 is not arranged on the substrate 20, it is possible to minimize a width in a direction which is vertical to the surface of the substrate 20. That is, the width in the direction vertical to the surface of the substrate 20 is not increased due to connection of the interface card 10. Consequently, it becomes possible to suppress the thickness of various kinds of the portable information equipment such as tablet-type PCs, smartphones, cell phones, electronic notebooks, etc.

Figure 3:
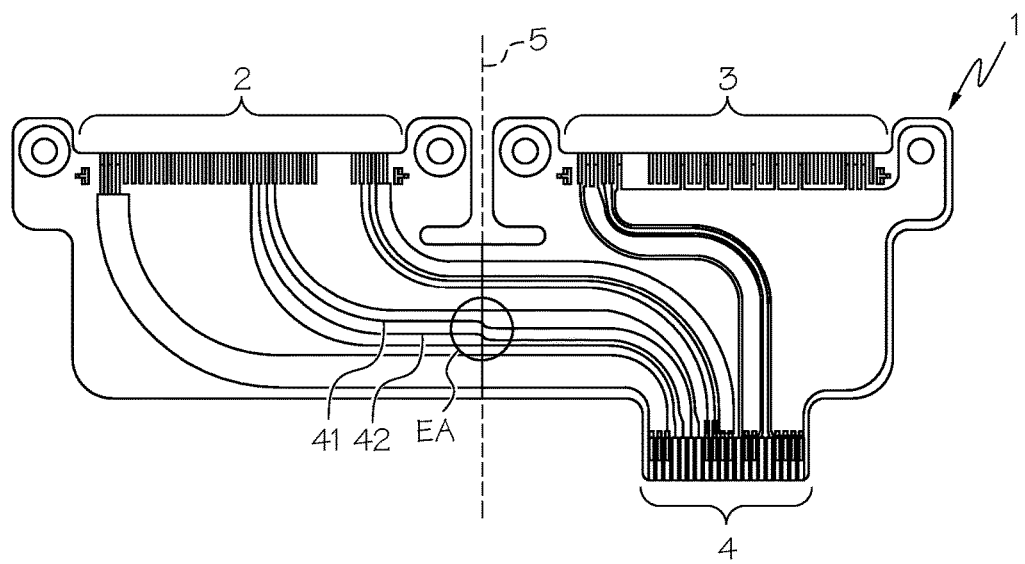
FIG. 3 illustrates a level difference has been provided in an area where each signal line on the flexible printed circuit board from FIG. 1 passes across a bend line.
Figure 4:
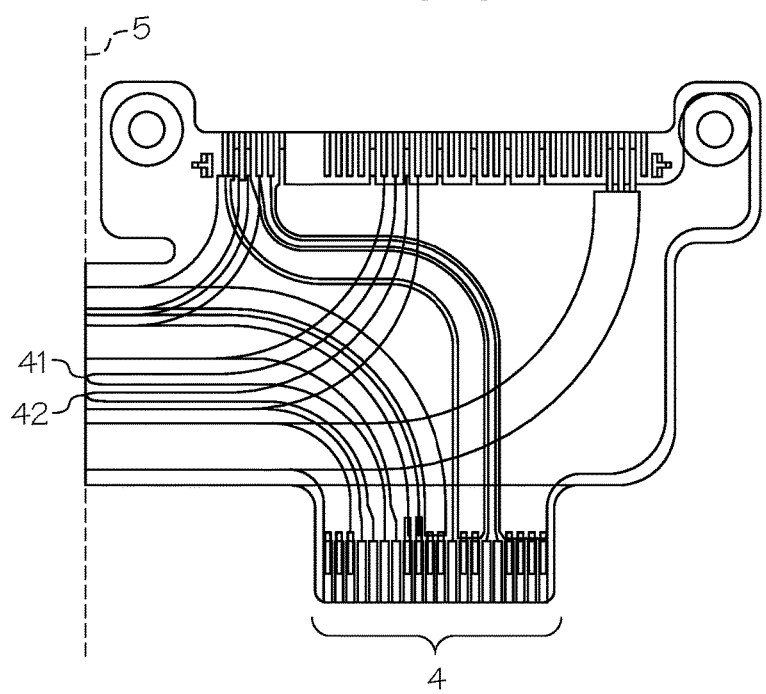
FIG. 4 illustrates the flexible printed circuit board from FIG. 3 has been bent.

FIG. 3 illustrates a level difference is formed in an area EA of the FPCB 1 where signal lines 41 and 42 pass across the bend line 5. The level difference is provided in order to prevent the signal lines 41 and 42 from being mutually superimposed when bending as illustrated in FIG. 4.

Figure 5:
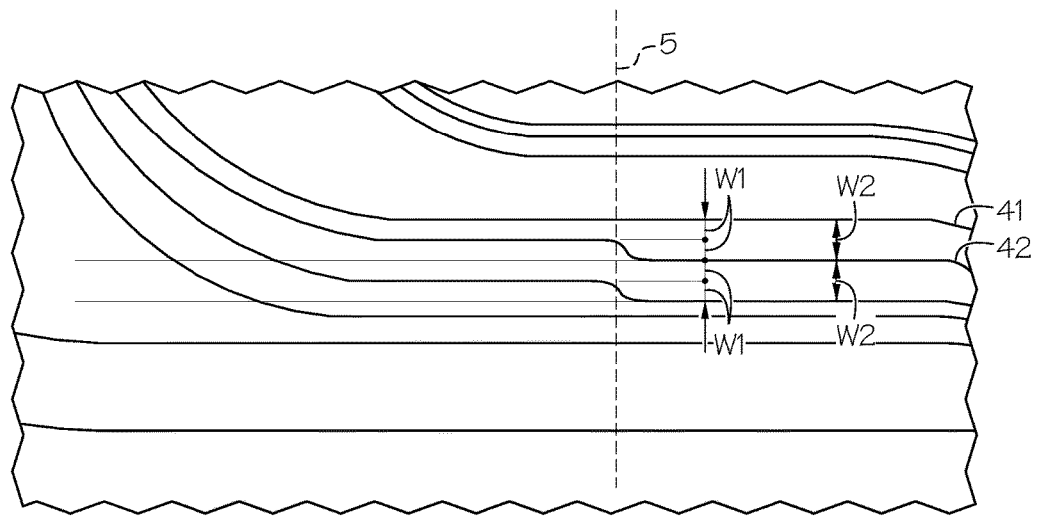
FIG. 5 is an enlarged view of the area illustrated in FIG. 3.

FIG. 5 is an enlarged diagram of the area EA in a state before the FPCB 1 is bent. As illustrated in FIG. 5, an inter-signal-line width between the signal lines 41 and 42 is printed so as to have a width W2 that is two times as wide as a width W1 such that the inter-signal-line width between the bent signal lines 41 and 42 has the width W1. In addition, the level difference is formed with the width W1.

It is possible to prevent cross-talk that would occur in association with bending of the FPCB 1 by providing the level differences on the above-mentioned signal lines 41 and 42. Provision of the level differences is effective, in particular, when signals that flow through the signal lines 41 and 42 are high in speed.

Figure 6:
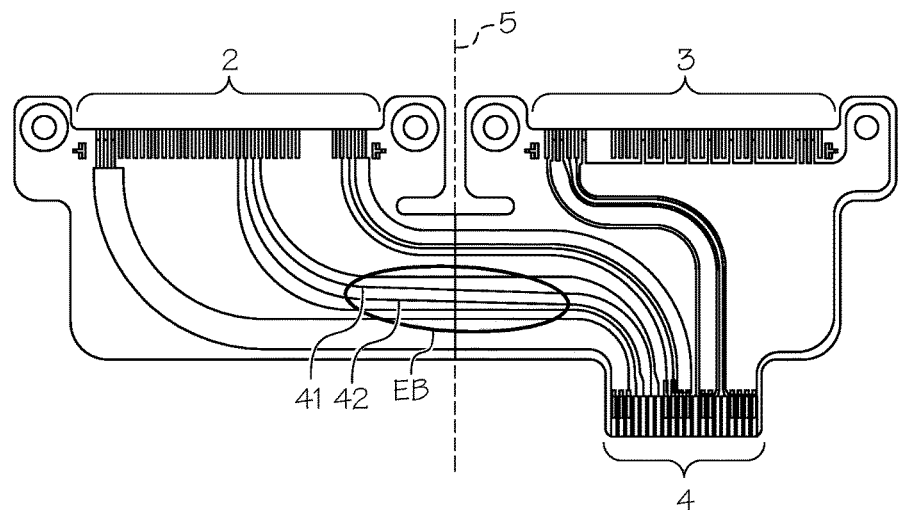
FIG. 6 illustrates the signal lines on the flexible printed circuit board from FIG. 1 have been wired so as to be incoming obliquely relative to the bend line in the area where the signal lines pass across the bend line.
Figure 7:
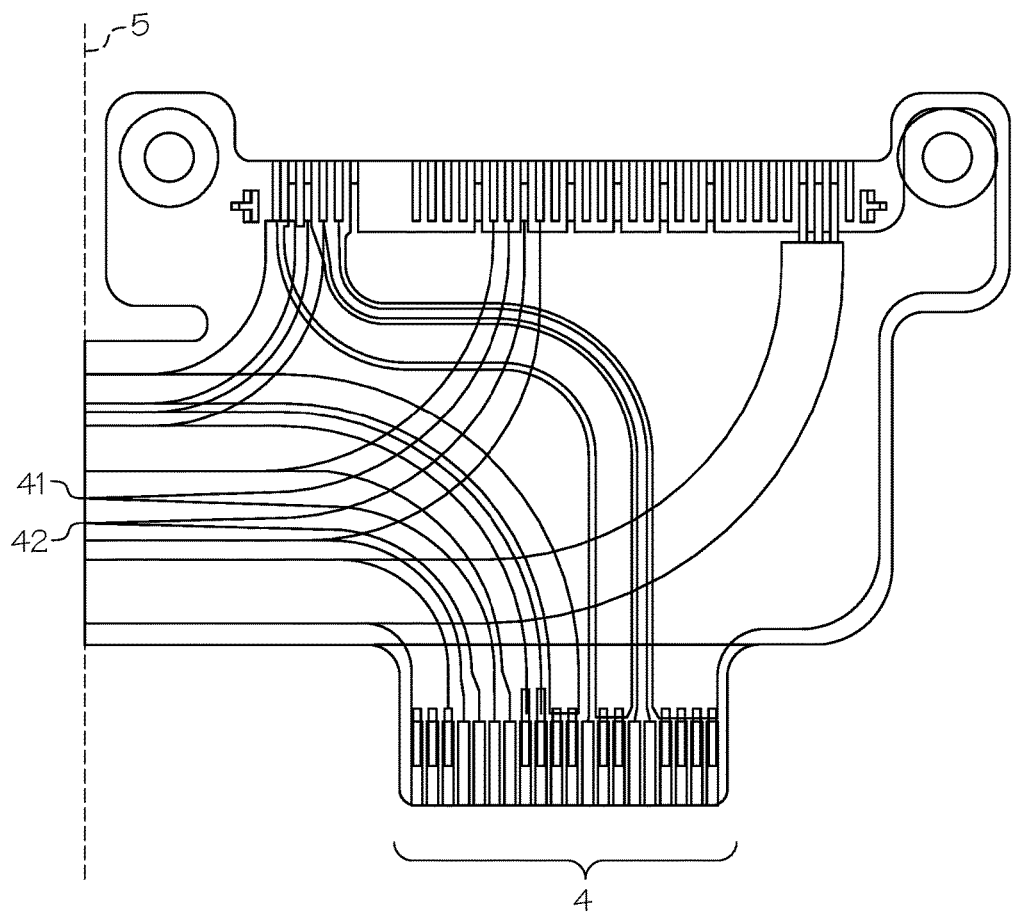
FIG. 7 illustrates the flexible printed circuit board from FIG. 6 has been bent.

Although, in the above-mentioned embodiment, the level difference is provided in order to reduce the cross-talk that would occur in association with bending of the FPCB 1, as an alternative, as illustrated in FIG. 6, the signal lines 41 and 42 in an area EB where the signal lines 41 and 42 pass across the bend line 5 may be wired so as to be incoming into the area. EB obliquely relative to the bend line 5 in order to prevent the signal lines 41 and 42 from being, mutually superimposed when the FPCB 1 is in a bent position. In this case, as illustrated in FIG. 7, when the FPCB 1 is bent, the signal lines 41 and 42 are folded back into a V-shaped form along the bend line 5 and the signal lines 41 and 42 are not mutually superimposed. Thus, the cross-talk between the signal lines 41 and 42 is reduced.

Incidentally, although in the above-mentioned embodiment, the other-end terminal group 4 is configured to be directly connected to the FPCB connector 21, a connector may be provided on the other-end terminal group 4 in order to establish connector connection with a connector on the substrate 20. Similarly, the other-end terminal group 4 may be connected to the substrate 20 by other connecting methods. For example, the other-end terminal group 4 may be directly connected to a terminal group provided on the substrate 20.

As has been described, the present invention provides a FPCB for connecting an interface card having connectors with a two-stage configuration to a thin-profile portable information equipment.

While the invention has been particularly shown and described with reference to a preferred embodiment, it will be understood by those skilled in the art that various changes in form and detail may be made therein without departing from the spirit and scope of the invention.

What is claimed is:

1. A flexible printed circuit board, comprising:
   a first-stage terminal group to be connected to a first-stage-side connector terminal group of an edge connector of an interface card;
   a second-stage terminal group to be connected to a second-stage side connector terminal group of said card edge connector of said interface card;
   a bend line located between said first-stage terminal group and said second-stage terminal group to allow said first-stage terminal group to be bent over said second-stage terminal group;
   a third terminal group to be connected to a connector located on a substrate;
   a first set of signal lines connecting said third terminal group to said first-stage terminal group; and
   a second set of signal lines connecting said third terminal group to said second-stage terminal group, wherein a first signal line within said second set of signal lines intersect said bend line perpendicularly such that said first signal line superimposes each other for a predetermined length from said bend line when said flexible printed circuit board is bent along said bend line, wherein a second signal line within said second set of signal lines intersects said bend line not perpendicularly such that said second signal line does not superimpose each other within said predetermined length from said bend line when said flexible printed circuit board is bent along said bend line;
   wherein a width between said first and second signal lines on one side of said bend line is at least two times wider than a width of said first and second signal lines on the other side of said bend line.

2. The flexible printed circuit board of claim 1, wherein said first set of signal lines does not intersect said bend line.

3. The flexible printed circuit board of claim 1, wherein said second signal lines that intersects said bend line is located obliquely relative to said bend line.

4. The flexible printed circuit board of claim 1, further comprising two openings for receiving a clamp to maintain said flexible printed circuit board in a bent state.

* * * * *